(12) United States Patent
Ham et al.

(10) Patent No.: US 11,678,512 B2
(45) Date of Patent: Jun. 13, 2023

(54) DISPLAY APPARATUS

(71) Applicant: LG Display Co., Ltd., Seoul (KR)

(72) Inventors: Jung-Hyun Ham, Paju-si (KR);
Seon-Mee Lee, Cheorwon-gun (KR);
Hyeok-Jun Kwon, Seoul (KR);
Young-Tae Kim, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 87 days.

(21) Appl. No.: 17/126,864

(22) Filed: Dec. 18, 2020

(65) Prior Publication Data
US 2021/0193973 A1 Jun. 24, 2021

(30) Foreign Application Priority Data
Dec. 20, 2019 (KR) .......................... 10-2019-0172014

(51) Int. Cl.
| | |
|---|---|
| *H10K 50/86* | (2023.01) |
| *H10K 50/842* | (2023.01) |
| *G02F 1/1335* | (2006.01) |
| *G02F 1/1333* | (2006.01) |
| *H01L 51/52* | (2006.01) |

(52) U.S. Cl.
CPC ...... *H01L 51/5284* (2013.01); *G02F 1/13336* (2013.01); *G02F 1/133512* (2013.01); *H01L 51/5246* (2013.01); *G02F 1/133502* (2013.01); *G02F 2201/44* (2013.01); *H01L 51/5281* (2013.01)

(58) Field of Classification Search
None
See application file for complete search history.

(56) References Cited

U.S. PATENT DOCUMENTS

| | | | |
|---|---|---|---|
| 2009/0015901 A1* | 1/2009 | Yamada | G02F 1/133502 359/259 |
| 2019/0339570 A1* | 11/2019 | Chen | H01L 51/5281 |

FOREIGN PATENT DOCUMENTS

| | | | |
|---|---|---|---|
| KR | 10-2011-0067436 A | | 6/2011 |
| KR | 20170133773 A | * | 10/2017 |
| KR | 10-2018-0063443 A | | 6/2018 |
| WO | WO-2017164485 A1 | * | 9/2017 ............. B32B 27/06 |

* cited by examiner

*Primary Examiner* — Shan Liu
(74) *Attorney, Agent, or Firm* — Birch, Stewart, Kolasch & Birch, LLP (57) ABSTRACT

Discussed is a display apparatus including a cover window, at least one first display panel arranged on a rear surface of the cover window, a first printed layer arranged on the rear surface of the cover window around the at least one first display panel, wherein reflected luminance of the first printed layer or a color of the first printed layer on color coordinates is formed within a set range so as to correspond to a first measurement value obtained by measuring reflected luminance of the at least one first display panel or a color of the at least one first display panel on the color coordinates.

17 Claims, 8 Drawing Sheets

DISPLAY APPARATUS

CROSS-REFERENCE TO RELATED APPLICATION

This application claims the priority benefit of the Korean Patent Application No. 10-2019-0172014, filed in the Republic of Korea on Dec. 20, 2019, all of which are hereby expressly incorporated by reference as if fully set forth herein into the present application.

BACKGROUND OF THE INVENTION

Field of the Invention

The present invention relates to a display apparatus, and more particularly, to a display apparatus including a display panel and a bezel provided around the display panel.

Discussion of the Related Art

Image displays, which display various pieces of information through a screen, are core technology of the information and communication age, and are being developed towards thinness, light weight and high performance. Accordingly, as flat panel displays which have reduced weight and volume and thus overcome the drawbacks of cathode ray tubes (CRTs), a liquid crystal display which displays an image by receiving light from a light source, an organic light emitting display which intrinsically emits light without any separate light source unit, etc. are receiving attention.

In these displays, a plurality of pixels is arranged in a matrix, thus displaying an image. Here, each pixel includes a light emitting element, and a pixel driving circuit including a plurality of transistors configured to independently drive the light emitting element.

Recently, research on slim and light display panels has been actively conducted, and display apparatuses in which display panels are bendable into a curved surface or are foldable and unfoldable are being supplied. Further, a structure in which a plurality of display panels is applied to one cover window is being developed.

However, as colors of a display panel and a bezel configured to surround the display panel are different from each other, the level of finish of the display apparatus can be poor. Further, when a plurality of display panels is arranged on the lower surface of one cover window, there is a sense of difference in colors between each of the display panels and a bezel, and thus research with the goal of solving this problem is underway.

SUMMARY OF THE INVENTION

Accordingly, the present invention is directed to a display apparatus that substantially obviates one or more problems due to limitations and disadvantages of the related art.

An object of the present invention is to provide a display apparatus which can improve the color and reflected luminance of printed layers provided on the upper and rear surfaces of a cover window to be within set ranges so that a display panel and a bezel can have similar colors, and particularly, when both an LCD (liquid crystal display) panel and an OLED (organic light emitting display) panel are applied to the display apparatus, can make the bezel have the same color as the two panels.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display apparatus includes a cover window, at least one first display panel arranged on a rear surface of the cover window, and a first printed layer arranged on the rear surface of the cover window around the at least one first display panel, wherein reflected luminance of the first printed layer or a color of the first printed layer on color coordinates is formed within a set range so as to correspond to a first measurement value obtained by measuring reflected luminance of the at least one first display panel or a color of the at least one first display panel on the color coordinates.

The first printed layer can include a black matrix layer.

The display apparatus can further include a second printed layer adhered to an upper surface of the cover window or the rear surface of the cover window.

The second printed layer can include an anti-fingerprint layer arranged as an uppermost layer, and an anti-glare layer arranged on a rear surface of the anti-fingerprint layer.

The second printed layer can further include an anti-reflection layer interposed between the anti-fingerprint layer and the anti-glare layer or between the rear surface of the cover window and the first printed layer.

In the second printed layer, at least a portion of the anti-reflection layer can penetrate the anti-glare layer and contacts the upper surface of the cover window.

The anti-glare layer can be arranged to be opposite the first printed layer, with the cover window therebetween.

The first printed layer or the second printed layer can be configured such that an allowable range of reflected luminance of the at least one first display panel is −0.13 to +0.13.

A target color of the first printed layer or the second printed layer can be set within a range from 4 points to 5 points at a maximum on the color coordinates when reflected luminance of the at least one first display panel is within a range of ±0.1.

The display apparatus can further include a second display panel arranged on the rear surface of the cover window so as to be spaced apart from the at least one first display panel, and implemented in a driving manner different from a driving manner of the at least one first display panel, the first printed layer can be arranged on the rear surface of the cover window at peripheral regions of the at least one display panel and the second display panel, and the second printed layer can be arranged on the upper surface of the cover window.

One of the at least one first display panel and the second display panel can be an LCD panel, and a remaining one thereof can be an OLED panel.

A target color of the first printed layer or the second printed layer can be set within a range from 3 points to 5 points at a maximum on the color coordinates when an average reflected luminance of the at least one first display panel and the second display panel is within a range of ±0.1.

As the average reflected luminance approaches 0, the range of the target color of the first printed layer or the second printed layer can be widened.

In another aspect of the present invention, a display apparatus includes a cover window, at least one first display panel arranged on a rear surface of the cover window, a second display panel spaced apart from the at least one first display panel, and implemented in a driving manner different from a driving manner of the at least one first display panel, a first printed layer arranged on the rear surface of the cover window around the at least one first display panel and the second display panel, and a second printed layer arranged on an upper surface of the cover window, wherein reflected luminance of the first printed layer or the second printed layer or a color of the first printed layer or the second printed layer on color coordinates is formed within a set range so as to correspond to an average of reflected luminances of the at least one first display panel and the second display panel or an average of colors of the at least one first display panel and the second display panel on the color coordinates.

The second printed layer can include an anti-fingerprint layer arranged as an uppermost layer, an anti-glare layer arranged on a rear surface of the anti-fingerprint layer, and an anti-reflection layer interposed between the anti-fingerprint layer and the anti-glare layer or between the rear surface of the cover windows and the first printed layer.

A target color of the first printed layer can be set within a range in which an average allowable limit in the color coordinates of the at least one first display panel and the second display panel is 3 points or more.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Advantages and features of the present invention and methods for achieving the same will become apparent from the description of the embodiments herein below with reference to the accompanying drawings. However, the present invention can be embodied in many alternative forms and should not be construed as being limited to the embodiments set forth herein, the embodiments of the present invention are provided only to completely disclose the invention and to completely inform those skilled in the art of the scope of the invention, and it is intended that the present invention is defined by the appended claims.

Shapes, sizes, ratio, angles and numbers disclosed in the drawings to describe the embodiments of the present invention are only exemplary and do not limit the present invention. In the following description of the embodiments and the drawings, the same or similar elements are denoted by the same reference numerals even when they are depicted in different drawings. In the following description of the embodiments of the present invention, a detailed description of known functions and configurations incorporated herein will be omitted when it can make the subject matter of the present invention rather unclear. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of characteristics, numbers, steps, operations, elements, parts or combinations thereof, or the possibility of adding the same, unless the term "only" is used. In the following description of the embodiment, singular expressions of elements can be intended to include plural expressions unless the context clearly indicates otherwise.

In the interpretation of elements included in the various embodiments of the present invention, it is to be interpreted that the elements include error ranges unless stated otherwise.

In the following description of the embodiments, it will be understood that, when positional relationships are expressed, for example, when an element is "on", "above", "under" or "beside" another element, the two elements can directly contact each other, or one or more other elements can be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements and may not define any order. Therefore, a first element described hereinafter can be a second element without departing from the technical scope of the invention.

In the following description of the embodiments, it will be understood that the terms "first", "second", "A", "B", "(a)", "(b)", etc. can be used to describe various elements. These terms are used merely to distinguish the corresponding elements from other elements, and do not limit the nature, sequence, order or number of the corresponding elements. When an element or layer is referred to as being "engaged with", "coupled to" or "connected to" another element or layer, it can be directly engaged with, coupled to or connected to the other element or layer or be engaged with, coupled to or connected to the other element or layer by yet another element, or intervening elements or layers can be "interposed" between the respective elements.

In the embodiments of the present invention, "display apparatuses" can include, in a narrow sense, display apparatuses, each of which includes a display panel and a driving unit to drive the display panel, such as a liquid crystal module (LCM), an organic light emitting diode (OLED) module and a quantum-dot (QD) module. Further, "display apparatuses" can include complete products (i.e., finished products) including an LCM, an OLED module and a QD module, such as a notebook computer, a TV, a computer monitor and an automotive display, other equipment display apparatuses for vehicles, and set electronic apparatuses or set apparatuses, such as a mobile electronic apparatus, i.e., a smartphone or an electronic pad.

Therefore, in the following description of the embodiments, display apparatuses can include, in a narrow sense, display apparatuses, such as an LCM, an OLED module and a QD module, and include application products or set apparatuses which are finished consumer products, including an LCM, an OLED module and a QD module.

Further, in some cases, an LCM, an OLED module and a QD module including a display panel and a driving unit can be referred to as display apparatuses in a narrow sense, and electronic apparatuses including an LCM, an OLED module and a QD module, which serve as complete products, can be referred to as set apparatus, so as to distinguish therebetween. For example, the display apparatus in a narrow sense can conceptually include an LCD, OLED or QD panel and a source PCB which is a controller to drive the display panel, and the set apparatus can conceptually further include a set PCB which is a controller conductively connected to the source PCB to control the entirety of the set apparatus.

As a display panel used in the embodiments of the present invention, all types of display panels, such as a liquid crystal display panel and an electroluminescent display panel, can be used. For example, as an electroluminescent display panel, an organic light emitting diode (OLED) panel, a quantum-dot (QD) light emitting diode panel or an inorganic light-emitting diode panel can be used. The display panel used in the embodiments of the present invention is not limited as to the form or size thereof.

For example, when a liquid crystal display panel is used as the display panel, the display panel includes a plurality of gate lines, a plurality of data lines, and pixels formed at intersections between the gate lines and the data lines. Further, the display panel can include an array substrate including thin film transistors which are switching elements for respectively adjusting light transmittance in the pixels, an upper substrate having color filters and/or a black matrix, and a liquid crystal layer formed between the array substrate and the upper substrate.

Alternatively, when an OLED panel is used as the display panel, the display panel includes a plurality of gate lines, a plurality of data lines, and pixels formed at intersections between the gate lines and the data lines. Further, the display panel can include an array substrate including thin film transistors which are elements for selectively applying voltage to the respective pixels, an organic light emitting diode (OLED) layer formed on the array, and an encapsulation substrate or an encapsulation layer arranged on the array so as to cover the OLED layer. The encapsulation substrate can protect the thin film transistors and the OLED layer from external impacts, and prevent moisture or oxygen from entering the OLED layer.

A layer formed on the array can include an inorganic light emitting layer, for example, a nano-sized material layer or quantum dots.

Further, a pad part connected to respective signal lines provided in a pixel array can be provided at one side of the edge of the array substrate, and the pad part can be connected to a circuit board which drives the display panel. A separate back plate can be adhered to the rear surface of the array substrate.

The display panel can include a touch panel arranged on the array substrate. Here, the touch panel and a polarizing film can be further provided on the upper surface of the array substrate. The polarizing film can prevent reflection of light entering from the outside and thus provide a function of improving visibility of the display panel. The touch panel can sense a user touch signal.

A light control film (LCF) can be provided on the touch panel. The LCF can adjust the angle of light emitted from the display panel and thus prevent a viewing angle from being wide in an unnecessary direction. A cover window can be provided at the outermost part of the display panel. A cover window can be formed of glass or plastic Hereinafter, a cover window applied as the cover glass will be described.

A transparent adhesive layer can be arranged between the polarizing film and the touch panel, between the touch panel and the LCF, and between the LCF and the cover window. A pressure sensitive adhesive (PSA) including an optically clear adhesive (OCA) or an optically clear resin (OCR) for UV hardening can be applied to these adhesive layers.

Figure 1:
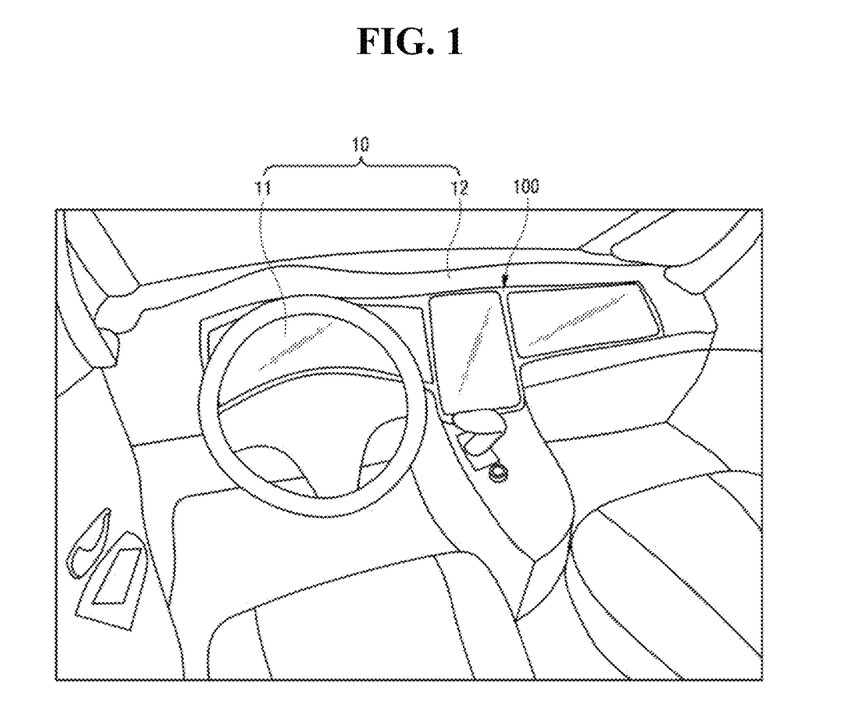
FIG. 1 is a perspective view illustrating a state in which a display apparatus according to one embodiment of the present invention is installed in a vehicle.

FIG. 1 is a perspective view illustrating a state in which a display apparatus according to one embodiment of the present invention is installed in a vehicle. All the components of the display apparatus according to all embodiments of the present invention are operatively coupled and configured.

Referring to FIG. 1, a display apparatus 100 according to one embodiment of the present invention can be installed on a dashboard 10 including an instrument panel 11 or a center fascia 12 in the vehicle. The display apparatus 100 is not limited to a rectangular shape, and can be manufactured to have any of various shapes, to which design elements are added. The display apparatus 100 integrates a display function and a touch function, and a cover glass 120 can be adhered to the entire surface of the display apparatus 100. At least one display panel 110 can be arranged on the rear surface of the cover glass 120, and a touch circuit board, etc. can be arranged on the rear surface of the display panel 110. The display panel 110 can be manufactured in a rigid structure having a set shape, or in a flexible structure which is bent in a set area thereof.

Figure 2:
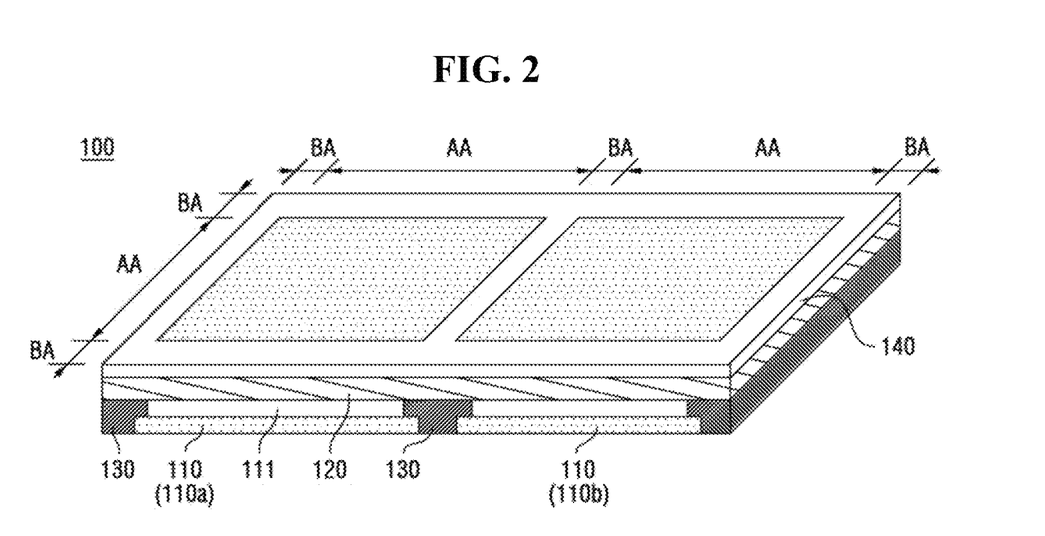
FIG. 2 is a longitudinal-sectional view of the display apparatus shown in FIG. 1.

FIG. 2 is a longitudinal-sectional view of the display apparatus 100 shown in FIG. 1.

Referring to FIG. 2, the display apparatus 100 according to the example of the present invention can include a first display panel 110a and a second display panel 110b provided on the rear surface of one cover glass 120. Of course, only one display panel can be provided on the rear surface of the cover glass 120. Further, the first display panel 110a and the second display panel 110b can be driven in the same manner or in different manners. For example, when the first display panel 110a and the second display panel 110b are driven in different manners, an LCD structure can be applied to the first display panel 110a, and an OLED structure can be applied to the second display panel 110b.

The first display panel 110a and the second display panel 110b can be arranged on the rear surface of the cover glass 120 so as to be spaced apart from each other. The upper surfaces of the first display panel 110a and the second display panel 110b can be adhered to the rear surface of the cover glass 120 by an adhesive layer 111. As described above, a pressure sensitive adhesive (PSA) including an optically clear adhesive (OCA) or an optically clear resin (OCR) for UV hardening can be applied to the adhesive layer 111. On the rear surface of the cover glass 120, an area in which the respective display panel 110a and 110b are located corresponds to an active area AA, and an area around the active area AA corresponds to a non-active area, i.e., a bezel area BA. A first printed layer 130 is located on the rear surface of the cover glass 120 in the bezel area BA, and a second printed layer 140 is located on the upper surface of the cover glass 120. The second printed layer 140 can be arranged on the upper surface of the cover glass 120 in at least regions opposite the first printed layer 130, or be arranged on the entire upper surface of the cover glass 120. One embodiment of the present invention illustrates the second printed layer 140 as being arranged to cover the entire upper surface of the cover glass 120 as one example.

For example, the first printed layer 130 is a black matrix layer and thus contributes to expression of a black color in the bezel area BA. Further, the second printed layer 140 can contribute to setting of reflected luminance, i.e., luminance reflected externally or reflected by direct light. Of course, the second printed layer 140 can contribute to correction of a difference between black colors in addition to setting reflected luminance. Therefore, the first printed layer 130 and the second printed layer 140 correct the black color and the reflected luminance represented by the bezel area BA so as to be similar to the black colors and the reflected luminances represented by the respective display panels within designated ranges, thereby allowing a user to recognize the black colors thereof as the same color. The first printed layer 130 can include at least one of modified acryl resin, carbon black, titanium dioxide, an ether solvent, cyclohexanone, N-butyl acetate, blocked isocyanate, pigments, or additives. Therefore, the display panels 110a and 110b can be arranged between two adjacent printed layer regions 130. That is, the side corner of each of the display panels 110a and 110b can correspond to the side corner of the first printed layer region 130.

Figure 3:
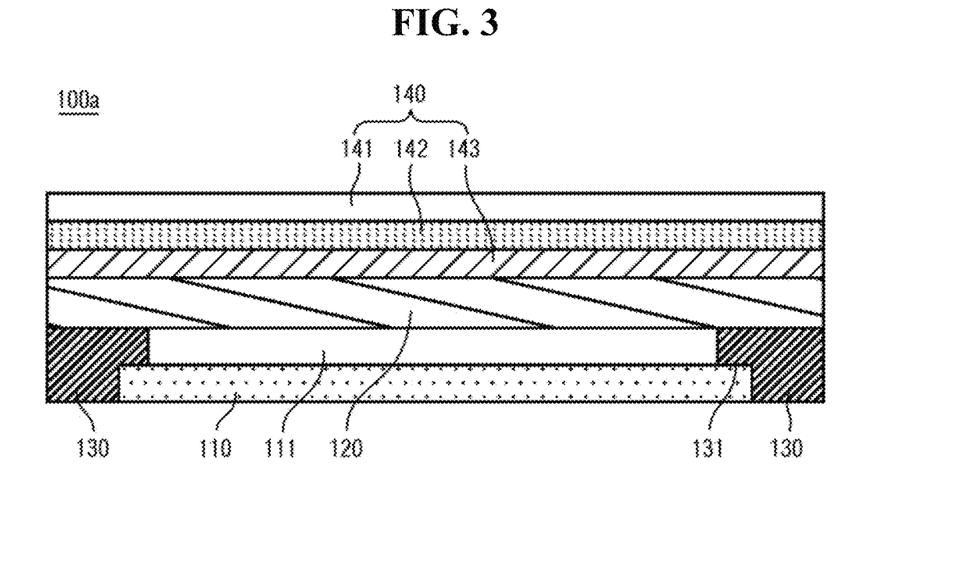
FIGS. 3 to 6 are longitudinal-sectional views illustrating a portion of each of the display apparatuses according to embodiments of the present invention, as shown in FIG. 2.

FIG. 3 is a longitudinal-sectional view illustrating a display apparatus according to a first embodiment of the present invention.

Referring to FIG. 3, in a display apparatus 100a according to the first embodiment of the present invention, a display panel 110 is adhered to the rear surface of a cover glass 120 by an adhesive layer 111, and a first printed layer 130 is arranged around the display panel 10.

A second printed layer 140 is arranged on the upper surface of the cover glass 120. The second printed layer 140 includes an anti-fingerprint layer 141 arranged as the uppermost layer, an anti-reflection layer 142 arranged on the rear surface of the anti-fingerprint layer 141, and an anti-glare layer 143 arranged between the rear surface of the anti-reflection layer 142 and the cover glass 120.

A special treatment can be performed on the surface of the anti-fingerprint layer 141 so that the anti-fingerprint layer 141 is not as easily smeared with stains such as fingerprints. The anti-fingerprint layer 141 prevents contamination from the outside using a water-repellent or oil-repellent function, thereby reducing contamination thereof with fingerprints and enabling easy removal of the same. For example, the anti-fingerprint layer 141 can be configured such that, even if the anti-fingerprint layer 141 is smeared with fingerprints, it is difficult to distinguish a portion smeared with the fingerprints and a portion not smeared with fingerprints from each other based on the refractive index of a material.

Further, by alternately coating the surface of the anti-reflection layer 142 with a low-refractive-index material and a high-refractive-index material, the anti-reflection layer 142 can reduce reflectance through destructive interference during an interfacial reflection process. Here, the anti-reflection layer 142 can reduce reflectance to 0.5% or less.

Further, the anti-glare layer 143 can reduce specular reflectance to external light, and thus increase visibility. For example, the anti-glare layer 143 is provided with an uneven structure formed on the upper surface thereof, and can thus reduce reflectance and prevent glare by scattering light using the uneven structure. That is, the anti-glare layer 143 can adjust the reflected luminance of light, and haze, i.e., light mist, can occur. Here, the anti-glare layer 143 can reduce reflectance to 2-2.5%.

By adjusting reflectance in this way, the second printed layer 140 having reflected luminance within a range corresponding to the reflected luminance of the display panel 110 can be manufactured. Of course, the second printed layer 140 can correct a color through the anti-reflection layer 142.

Figure 4:
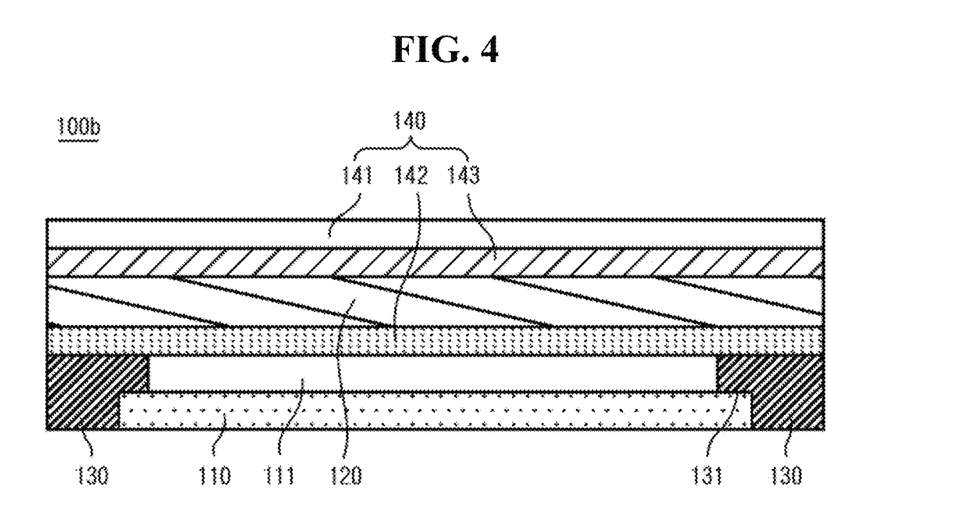

FIG. 4 is a longitudinal-sectional view illustrating a display apparatus according to a second embodiment of the present invention.

Referring to FIG. 4, in a display apparatus 100b according to the second embodiment of the present invention, a display panel 110 is adhered to the rear surface of a cover glass 120 by an adhesive layer 111, and a first printed layer 130 is arranged around the display panel 110. Further, a second printed layer 140 is arranged on the upper and rear surfaces of the cover glass 120.

First, the first printed layer 130 can be formed of a black matrix layer, and be printed in a color corresponding to the color of the display panel 110.

The second printed layer 140 includes an anti-glare layer 143 arranged on the upper surface of the cover glass 120, an anti-fingerprint layer 141 arranged on the upper surface of the anti-glare layer 143, and an anti-reflection layer 142 arranged on the rear surface of the cover glass 120. Here, the first printed layer 130 can be formed on the rear surface of the anti-reflection layer 142, and the display panel 110 can also be adhered to the rear surface of the anti-reflection layer 142 by the adhesive layer 111.

Figure 5:
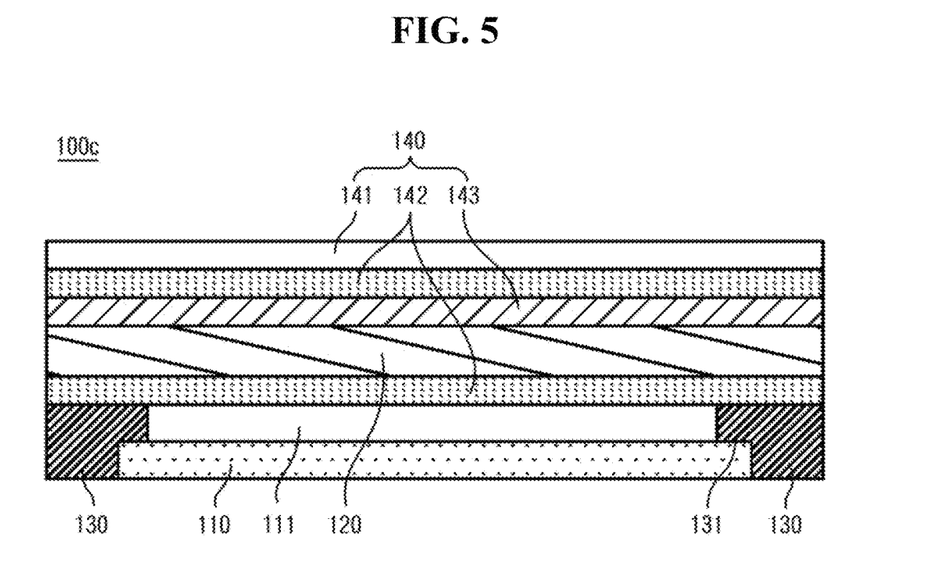

FIG. 5 is a longitudinal-sectional view illustrating a display apparatus according to a third embodiment of the present invention.

Referring to FIG. 5, in a display apparatus 100c according to the third embodiment of the present invention, a display panel 110 is adhered to the rear surface of a cover glass 120 by an adhesive layer 111, and a first printed layer 130 is arranged around the display panel 110. Further, a second printed layer 140 is arranged on the upper and rear surfaces of the cover glass 120.

The second printed layer 140 includes an anti-fingerprint layer 141 arranged as the uppermost layer, an anti-reflection layer 142 arranged on the rear surface of the anti-fingerprint layer 141, an anti-glare layer 143 arranged between the rear surface of the anti-reflection layer 142 and the cover glass 120, and another anti-reflection layer 142 arranged on the rear surface of the cover glass 120. That is, the display apparatus 100c according to the third embodiment can be implemented through a combination of the display apparatuses 100a and 100b according to the first and second embodiments. Therefore, a detailed description of elements according to the third embodiment, which are substantially the same as those of the first and second embodiment, will be omitted because it is considered to be unnecessary.

Figure 6:
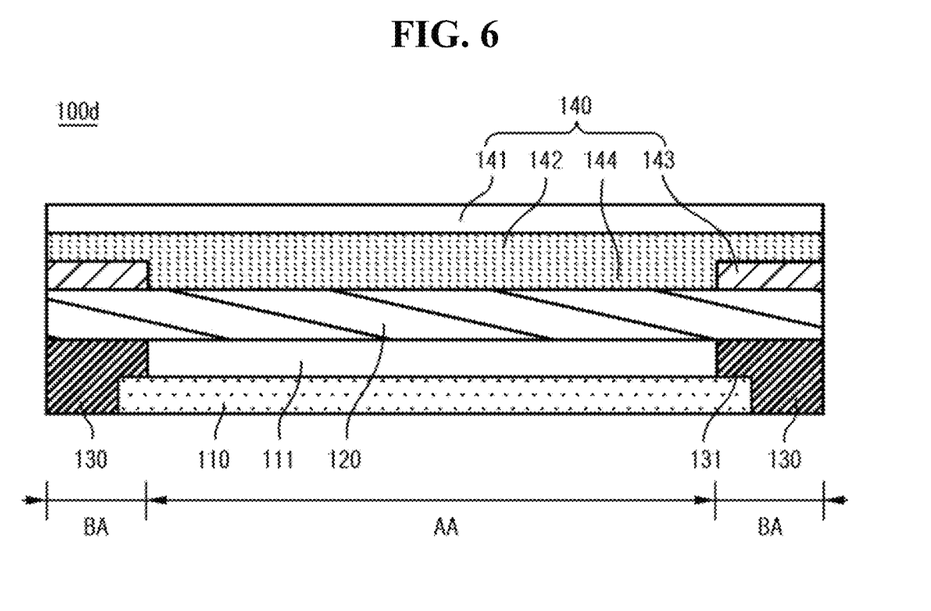

FIG. 6 is a longitudinal-sectional view illustrating a display apparatus according to a fourth embodiment of the present invention.

Referring to FIG. 6, in a display apparatus 100d according to the fourth embodiment of the present invention, a display panel 110 is adhered to the rear surface of a cover glass 120 by an adhesive layer 111, and a first printed layer 130 is arranged around the display panel 110. Further, a second printed layer 140 is arranged on the upper surface of the cover glass 120.

The second printed layer 140 includes an anti-fingerprint layer 141 arranged as the uppermost layer, an anti-reflection layer 142 arranged on the rear surface of the anti-fingerprint layer 141, and an anti-glare layer 143 arranged between the rear surface of the anti-reflection layer 142 and the cover glass 120. Here, the anti-reflection layer 142 includes an extension part 144 which penetrates the anti-glare layer 143 towards the cover glass 120. Here, the extension part 144 can be arranged so as to correspond to the active area AA of the display panel 110. That is, the anti-glare layer 143 can be located at a position in the bezel area BA opposite the first printed layer 130 with the cover glass 120 provided therebetween, and be arranged so as to contribute to correction of reflected luminance without interfering with a direction in which an image is displayed in the active area AA. Therefore, the display apparatus according to one embodiment of the present invention can correct reflected luminance of light and haze by the arrangement structure of the second printed layer 140 and the combination of the respective layers 141, 142 and 143 of the second printed layer 140.

Further, in each of the above-described embodiments, the first printed layer 130 can include a stepped part 131 in a region thereof facing the display panel 110 depending on the thickness of the first printed layer 130. The stepped part 131 can have a staircase structure which is subdivided more than the structure shown in the accompanying figures. The stepped part 131 of the first printed layer 130 can be formed by performing a printing process a plurality of times, thereby being capable of preventing formation of a gap between the display panel 110 and the first printed layer 130 or preventing formation of an air layer between the first printed layer 130 and the adhesive layer 111. The height of the stepped part 131 can be equal to or higher than the height of the adhesive layer 111. A corner region of the stepped part 131 and corner region of the adhesive layer 111 can be disposed adjacent therebetween. Further, the total height of the first printed layer 130 can be equal to the sum of the height of the display panel 110 and the height of the adhesive layer 111. Although the figures illustrate a structure in which the first printed layer 130 is arranged at two opposite side surfaces of the display panel 110, the first printed layer 130 can be arranged so as to surround the respective side surfaces, i.e., four side surfaces, of the display panel 110.

Hereinafter, a method for designing a first printed layer and a second printed layer in a display apparatus according to the present invention such that a difference in visible appearances between display panels and a bezel is not recognized will be described.

Figure 7:
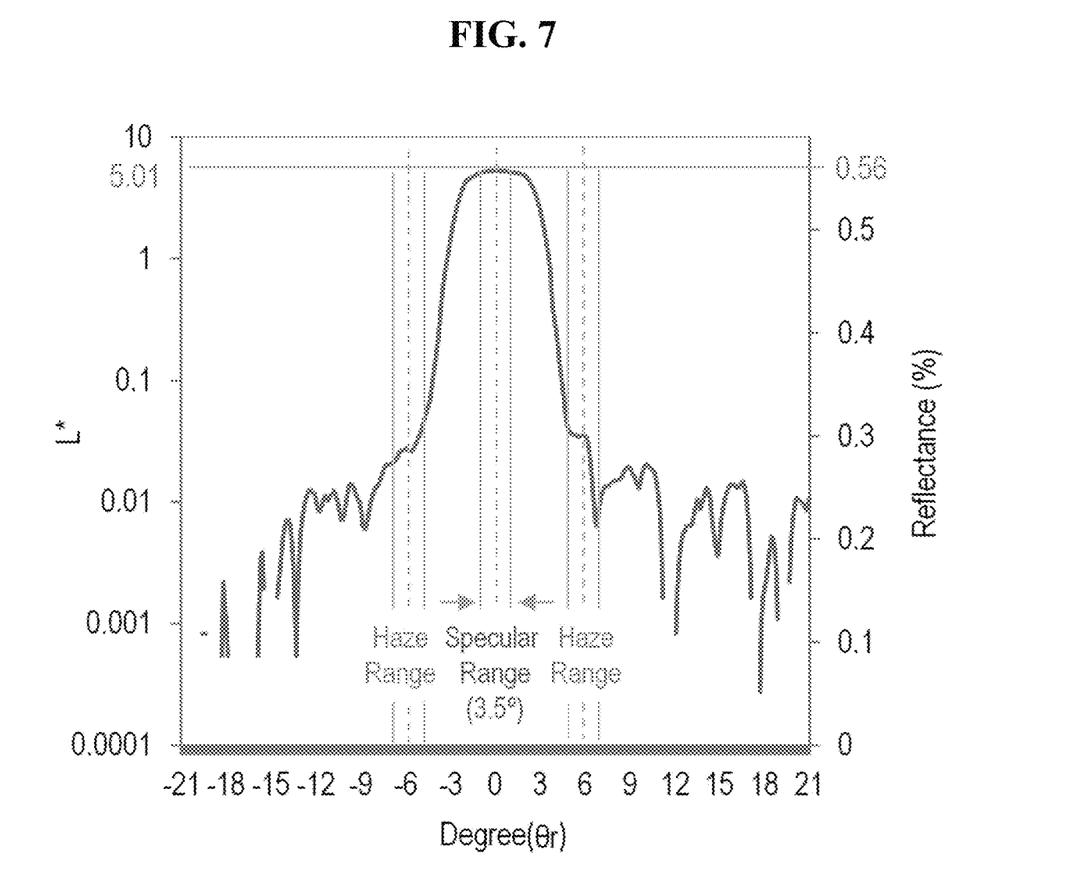
FIG. 7 is a graph showing a distribution of reflected luminance of an OLED panel according to an embodiment of the present invention.
Figure 8:
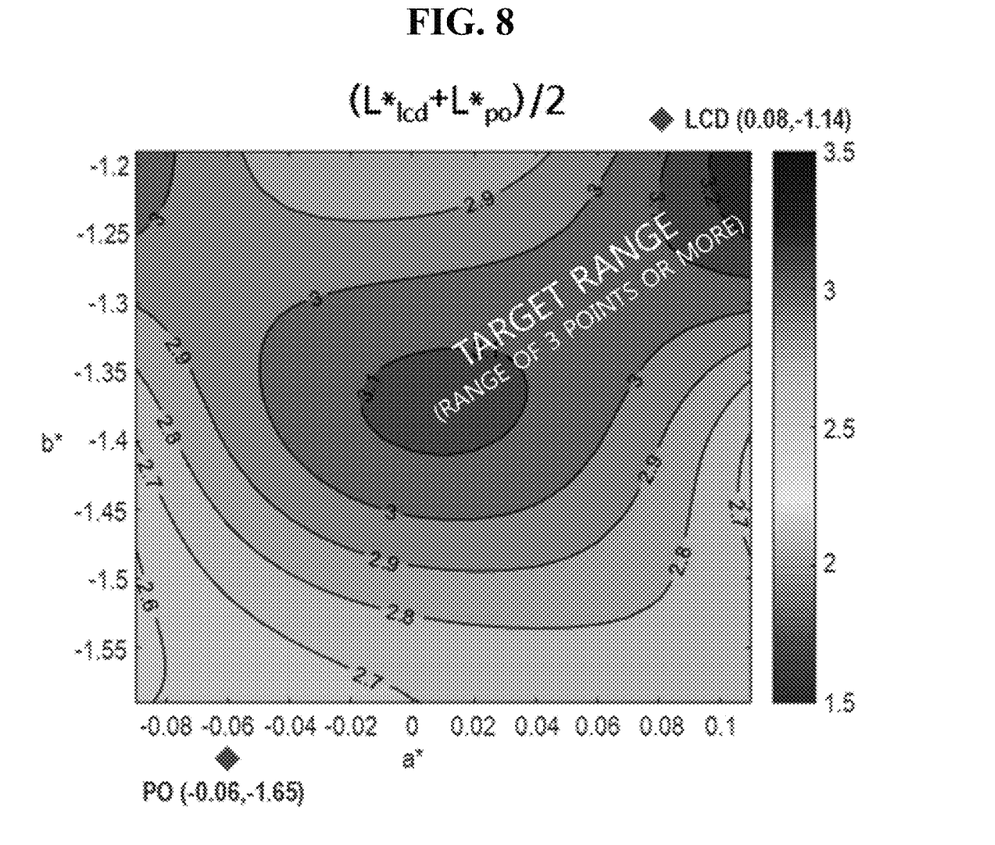
FIG. 8 is a graph showing color coordinates of a combination of an LED panel and an OLED panel.
Figure 9A:
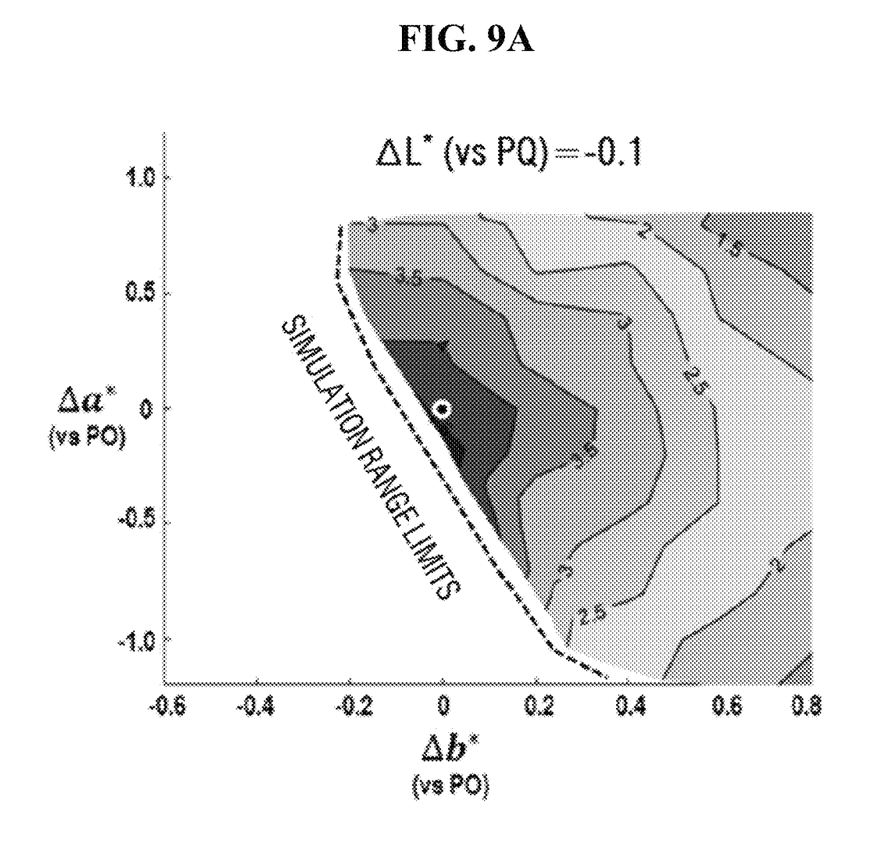
FIGS. 9A to 9C are graphs showing color coordinates of a combination of a plurality of OLED panels.
Figure 9B:
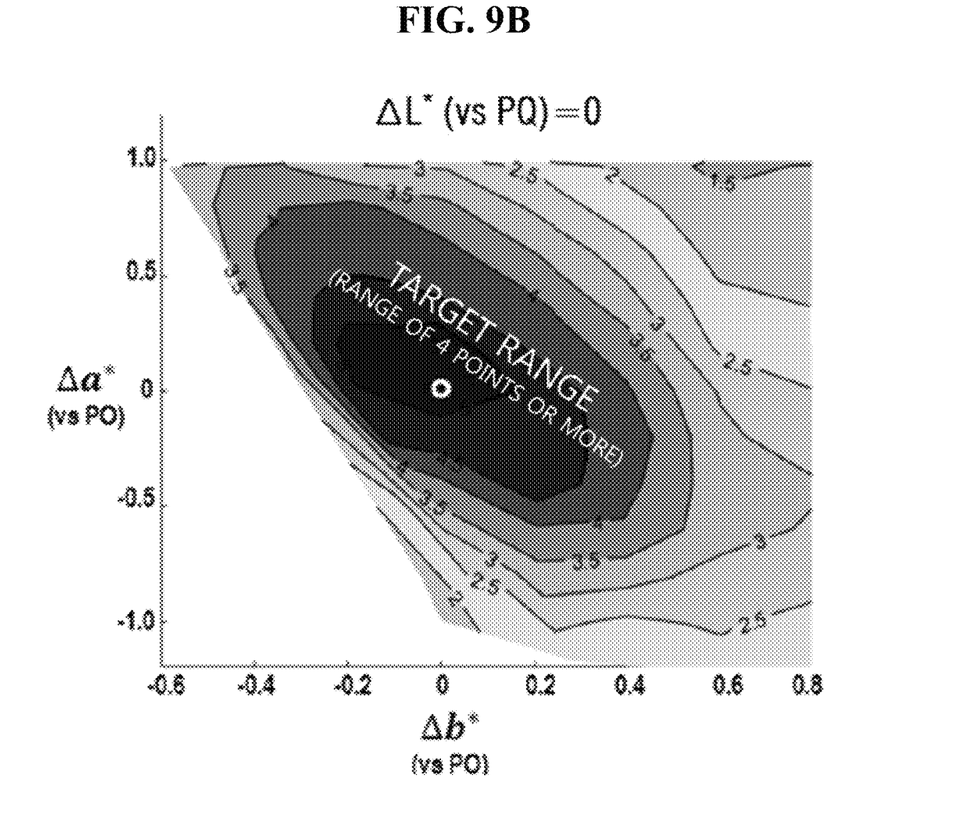
Figure 9C:
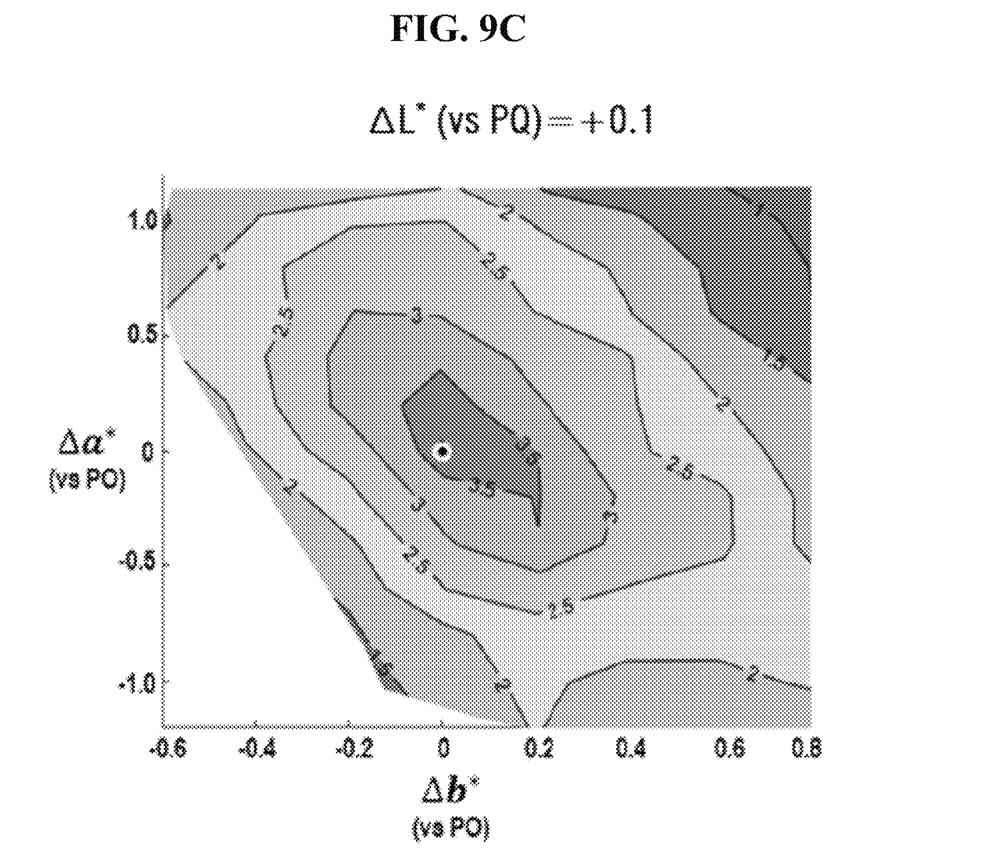

FIG. 7 is a graph showing a distribution of reflected luminance of an OLED panel according to an embodiment of the present invention, FIG. 8 is a graph showing color coordinates of a combination of an LED panel and an OLED panel, and FIGS. 9A to 9C are graphs showing color coordinates of assemblies including a plurality of OLED panels.

In a state in which the display apparatus is switched off, measured color difference values between the display panels and the bezel are less than a critical value ($\Delta E\_ab^* < 2$), but a great difference in visible appearances therebetween in the same color, i.e., black, can be recognized due to luminosity contrast, as given in Table 1 below. Therefore, when the reflected luminances and color differences of the display panels are measured and then the reflected luminance and color difference of the bezel are corrected so as to coincide thereto or to be close thereto within designated set ranges, the display panels and the bezel can have the same color, or a user recognize the display panels and the bezel as having the same color, or even if there is a slight difference between the colors of display panels and the bezel, the difference can be reduced to an acceptable extent, thereby consequently reducing a difference in visible appearances between the display panels and the bezel.

For example, Table 1 shows results of evaluation of degrees of perception of the LCD panel, the OLED panel and the bezel at an illumination of 5,000 1x.

TABLE 1

| Evaluation score | LCD | OLED | Bezel |
| --- | --- | --- | --- |
| When luminosity contrast does not occur | 6.1 | 6.0 | 5.6 |
| When luminosity contrast occurs | 6.8 | 4.2 | 2.5 |

As stated in Table 1, it can be confirmed that, when there is no luminosity contrast, the degrees of perception of the respective display panels and the bezel are similar to one another, but when a luminosity contrast exists, there are a great difference in evaluation scores of the degrees of perception between the respective display panels and the bezel. That is, the luminosity contrast can be a factor that causes a difference in visible appearances between the display panels and the bezel. In order to reduce the difference in visible appearances, reflected luminance can be first corrected, and then a color difference can be corrected. For example, when correction of reflected luminance is first carried out, it can be easy to correct a color difference.

Reflected luminance is measured by a 2D reflectance measurement method and a composite reflection property analysis method. In the 2D reflectance measurement method, reflectance is measured by a reflectometer. Further, in the composite reflection property analysis method, reflection properties can be analyzed through specular reflection, haze components and Lambertian reflection. Even when total reflectance is fixed, visible appearance characteristics can be differently perceived according to the combination or distribution of the reflection components.

For example, as a result of analysis of the OLED panel, reflection by the OLED display was classified into the specular reflection and the haze components, and these components accounted for reflectances of 0.56% and 4-7%, respectively. Table 2 below shows results of measurement and calculation of reflection distribution using the composite reflection property analysis method.

TABLE 2

| | Specular reflectance (%)/L* | Haze (%) | | |
| --- | --- | --- | --- | --- |
| Reflectance | | 6° | 7° | 8° |
| OLED panel | 0.56/5.01 | 7.11 | 5.17 | 4.14 |

Here, the specular reflectance can be calculated as a value obtained by dividing the sum of reflected luminances within an angle of specular reflection of 3.5° (Ls) by reference reflected luminance (Lref). Further, the haze component can be calculated as a value obtained by dividing the sum of reflected luminances at points of angles of 6°, 7° and 8° in a specular reflection direction and the reflected luminances within the angle of specular reflection of 3.5° by Ls. The reflection distribution of the OLED panel, which was analyzed in this way, is shown in FIG. 7.

Referring to FIG. 7, a narrow and long specular range is formed within an angle of about 3.5°, and haze ranges are formed around angles of ±6°. Lambertian ranges can be formed around angles deviating from the haze ranges. Next, a color difference can be expressed using display methods of ΔE* and grayscale.

First, ΔE* is a geometric distance between two points in the (L*, a*, b*) color space, and is expressed by Equation 1 below.

$$\Delta E^* = \sqrt{(L^*)^2 + (a^*)^2 + (b^*)^2} \quad \text{[Equation 1]}$$

Here, as the value of L* increases, L* is closer to white (W), and as the value of L* decreases, L* is closer to black (B). Further, as the value of increases, a* is closer to red (R), and as the value of a* decreases, a* is closer to green (G). Moreover, as the value of b* increases, b* is closer to yellow (Y), and as the value of b* decreases, b* is closer to blue (B). In general, when ΔE* is less than 1.5, it can be difficult to recognize a difference in visible appearances. For example, when ΔE*≤0.8, the display panel is determined as enabling fine color mixing, and when ΔE*≤1.6, the display panel is acceptable for commercial sale.

Further, nominal scales are used as a type of reference that is used when a degree of discoloration or allochroism is determined using a visual method (levels of perception). The nominal scales are phased scales in which pairs of different defined colors in a grayscale chart are combined, and each scale can provide five (or nine) geometrically progressing levels for determining a color difference on a scale of 1-5 points. For example, the nominal scale can pertain to grayscale values. A method for obtaining a scale based on the value of ΔE* will be shown in Table 3 below.

TABLE 3

| ΔE* | Nominal scale |
|---|---|
| Less than 0.2 | 5 |
| 0.2 ≤ E < 1.0 | 4-5 |
| 1.0 ≤ E < 1.7 | 4 |
| 1.7 ≤ E < 2.4 | 3-4 |
| 2.4 ≤ E < 3.4 | 3 |
| 3.4 ≤ E < 5.2 | 2-3 |
| 5.2 ≤ E < 7.5 | 2 |
| 7.5 ≤ E < 10.4 | 1-2 |
| 10.4 or more | 1 |

In Table 3, a nominal scale value of 5 points indicates a level at which a difference in visible appearances is not recognized, a nominal scale value of 4 points indicates a level at which a difference in visible appearances is recognized but is not distracting, a nominal scale value of 3 points indicates a level at which a difference in visible appearances is acceptable, a nominal scale value of 2 points indicates a level at which a difference in visible appearances is somewhat distracting, and a nominal scale value of 1 point indicates a level at which a difference in visible appearances is highly distracting. A difference in visible appearances between the display panels and the bezel can be removed by correcting the reflected luminances thereof and the color difference therebetween.

In one example, if a first display panel (i.e., an LCD panel) and a second display panel (i.e., an OLED panel) are arranged on one cover glass, the luminances and limits in color perception of the first display panel and the second display panel are derived. Here, an illumination of 5,000 1× is provided. An allowable limit in reflected luminance will be calculated using Equation 2 below.

$$L^* = \frac{L^*_{LCD} + L^*_{OLED}}{2} \quad \text{[Equation 2]}$$

Using Equation 2, the allowable limit in reflected luminance can be calculated as the average of the reflected luminance of the first display panel and the reflected luminance of the second display panel. An allowable limit in color coordinates can be represented based on 3 points (with reference to FIG. 8). If the allowable limit in reflected luminance is not calculated as an average, a target range on the color coordinates may not be derived.

In another example, if a first display panel (i.e., an OLED panel) and a second display panel (i.e., an OLED panel) are arranged on one cover glass, the luminances and limits in color perception of the first display panel and the second display panel are derived. Here, an illumination of 5,000 1× is provided. As such, when at least two display panels are driven in the same manner, the allowable limit in reflected luminance ΔL* can be within the range of ±0.1, and in this case, the allowable limit in color coordinates can be applied based on 4 points. That is, this combination of the OLED panel and the OLED panel can a narrow difference in visible appearances between the display panels and the bezel compared to the above-described combination of the LCD panel and the OLED panel. As the allowable limit in reflected luminance (including the average) approaches 0, the target range of colors can be widened. That is, colors can be more easily matched (with reference to FIGS. 9A to 9C).

Referring to FIGS. 9A to 9C, it can be confirmed that when the allowable limit in reflected luminance ΔL* is −0.1, an allowable limit in color coordinates up to 4.5 points is possible, as shown in FIG. 9A, but when the allowable limit in reflected luminance ΔL* is 0, the allowable limit in the color coordinates is wider, as shown in FIG. 9B. However, it can be confirmed that when the allowable limit in reflected luminance ΔL* is +0.1, the allowable limit in the color coordinates reaches only 3.5 points at a maximum, as shown in FIG. 9C. Of course, it can be confirmed from these results that, as the allowable limit in reflected luminance ΔL* approaches 0, the allowable limit in the color coordinates increases, and particularly, the allowable limit in the color coordinates when the allowable limit in reflected luminance ΔL* is −0.1 is greater than the allowable limit in the color coordinates when the allowable limit in reflected luminance ΔL* is 0.

It can be determined that, when the reflectance distribution characteristics and color coordinates of the printed layer of the bezel are located within target ranges, the visible appearance and characteristics of the bezel are equal or similar to those of the display panels.

In this regard, results of correction of the reflected luminances and haze components of the first printed layer and the second printed layer so as to match the results of analysis of the OLED panel are shown in FIG. 4.

TABLE 4

| Reflectance | Specular reflectance (%)/L* | Haze (%) |
|---|---|---|
| OLED panel | 0.56/5.01 | 7.11 |
| Bezel (A) | 0.64/5.76 | 1.29 |
| Bezel (B) | 0.54/4.87 | 6.08 |

Referring to FIG. 4, the value of ΔL* between the OLED panel and the bezel B was about −0.14, and particularly, the specular reflectance difference therebetween was 0.02% and the haze component difference therebetween was within about 1%. Additionally, the value of Δa* therebetween was 0.17, and the value of Δb* therebetween was −0.15. It can be confirmed from these results corresponds to a level (of 4 points) at which a difference in visible appearances between the OLED panel and the bezel B is recognized but is not distracting. In each graph of FIGS. 9A to 9C, a portion of the left rear end of the graph, which is deleted, is a region in which measurement and result derivation cannot be performed due to the range limits of simulation, but, based on that the derived graph having an approximately symmetrical structure in which uniform ranges or sizes are distributed in the horizontal and vertical directions around the center of the highest point thereof, it can be inferred that in this portion, results around the center of the highest point would be almost similar. Of course, although the above-described results are results of measurement of specular reflection and haze components of an OLED panel, an LCD panel can also be used.

Therefore, the display apparatus according to the present invention can measure black colors of the display panel and the bezel, and correct reflected luminances and color differences of the respective printed layers provided in the bezel so that the display panel and the bezel can have the same color. By correcting the reflected luminances and the color differences of the printed layers so that the display panel and the bezel can express the same color or be recognized as expressing the same color by a user, the display apparatus can be developed and differentiated through visible appearance integration thereof.

Further, if the display apparatus includes a plurality of display panels provided on the rear surface of one cover glass, color coordinates are designed by setting the allowable limit in reflected luminance of the respective display panels to the average of the reflected luminances of the respective display panels, and thus the bezel can be designed to express the same color as that of the display panels or be corrected so as to be recognized as expressing the same color as that of the display panels, regardless of whether display panels of the same kind or different kinds are disposed.

As is apparent from the above description, a display apparatus in accordance with one or more embodiments of the present invention has the following effects and advantages.

The display apparatus according to one or more embodiments of the present invention can measure black colors of a display panel and a bezel, and correct reflected luminances and color differences of respective printed layers provided in the bezel so that the display panel and the bezel can have the same color. By correcting the reflected luminances and the color differences of the printed layers so that the display panel and the bezel can express the same color or be recognized as expressing the same color by a user, the display apparatus can be developed and differentiated through visible appearance integration thereof.

Further, if the display apparatus includes a plurality of display panels provided on the rear surface of one cover glass, color coordinates are designed by setting the allowable limit in reflected luminance of the respective display panels to the average of the reflected luminances of the respective display panels, and thus the bezel can be designed to express the same color as that of the display panels or be corrected so as to be recognized as expressing the same color as that of the display panels, regardless of whether display panels of the same kind or different kinds are disposed.

The features, structures and effects described in the above embodiments of the present invention are included in at least one embodiment of the present invention, but are not limited to the one embodiment. Further, it will be apparent to those skilled in the art that the features, structures and effects described in the at least one embodiment of the present invention can be combined or modified into other embodiments. Therefore, content related to these combinations and modifications should be interpreted as being included in the scope of the invention.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A display apparatus comprising:
  a cover window;
  at least one first display panel arranged on a rear surface of the cover window;
  a first printed layer arranged on the rear surface of the cover window around the at least one first display panel; and
  a second printed layer adhered to the cover window,
  wherein the second printed layer comprises:
    an anti-fingerprint layer arranged as an uppermost layer,
    an anti-glare layer arranged beneath the anti-fingerprint layer, and
    an anti-reflection layer interposed between the anti-fingerprint layer and the anti-glare layer, and
  wherein, in the second printed layer, at least a portion of the anti-reflection layer penetrates the anti-glare layer and contacts an upper surface of the cover window.
2. The display apparatus according to claim 1, wherein the first printed layer comprises a black matrix layer.
3. The display apparatus according to claim 1, wherein a reflected luminance of the first printed layer or a color of the first printed layer on color coordinates is formed within a set range so as to correspond to a first measurement value obtained by measuring a reflected luminance of the at least one first display panel or a color of the at least one first display panel on the color coordinates.
4. The display apparatus according to claim 3, wherein the first printed layer or the second printed layer is configured so that an allowable range of the reflected luminance of the at least one first display panel is approximately −0.13 to +0.13.
5. The display apparatus according to claim 4, wherein a target color of the first printed layer or the second printed layer is set within a range from 4 points to 5 points at a maximum on the color coordinates in a case the reflected luminance of the at least one first display panel is within a range of approximately ±0.1.

6. The display apparatus according to claim 5, wherein, as an average reflected luminance approaches 0, the range of the target color of the first printed layer or the second printed layer is widened.

7. The display apparatus according to claim 4, further comprising a second display panel arranged on the rear surface of the cover window so as to be spaced apart from the at least one first display panel, and implemented in a driving manner different from a driving manner of the at least one first display panel,
wherein the first printed layer is arranged on the rear surface of the cover window at peripheral regions of the at least one display panel and the second display panel, and the second printed layer is arranged on the upper surface of the cover window.

8. The display apparatus according to claim 7, wherein one of the at least one first display panel and the second display panel is a liquid crystal display (LCD) panel, and a remaining one thereof is an organic light emitting display (OLED) panel.

9. The display apparatus according to claim 8, wherein a target color of the first printed layer or the second printed layer is set within a range from 3 points to 5 points at a maximum on the color coordinates when an average reflected luminance of the at least one first display panel and the second display panel is within a range of approximately ±0.1.

10. The display apparatus according to claim 1, wherein, in the second printed layer, the portion of the anti-reflection layer and the anti-glare layer contact the upper surface of the cover window.

11. The display apparatus according to claim 10, wherein the anti-glare layer is arranged to be opposite the first printed layer, with the cover window therebetween.

12. A display apparatus comprising:
a cover window;
at least one first display panel arranged on a rear surface of the cover window;
a second display panel spaced apart from the at least one first display panel, and implemented in a driving manner different from a driving manner of the at least one first display panel;
a first printed layer arranged on the rear surface of the cover window around the at least one first display panel and the second display panel; and
a second printed layer arranged on an upper surface of the cover window,
wherein the second printed layer comprises:
an anti-fingerprint layer arranged as an uppermost layer,
an anti-glare layer arranged beneath the anti-fingerprint layer, the anti-glare layer positioned at an area corresponding to the first printed layer, and
an anti-reflection layer including a first part interposed between the anti-fingerprint layer and the anti-glare layer and a second part interposed between the anti-fingerprint layer and the cover window, and
wherein a lower surface of the anti-glare layer and a lower surface of the second part of the anti-reflection layer contact the upper surface of the cover window.

13. The display apparatus according to claim 12, wherein a reflected luminance of the first printed layer or the second printed layer, or a color of the first printed layer or the second printed layer on color coordinates is formed within a set range so as to correspond to an average of reflected luminances of the at least one first display panel and the second display panel or an average of colors of the at least one first display panel and the second display panel on the color coordinates.

14. The display apparatus according to claim 13, wherein a target color of the first printed layer is set within a range in which an average allowable limit in the color coordinates of the at least one first display panel and the second display panel is 3 points or more.

15. The display apparatus according to claim 12, wherein the second part of the anti-reflection layer is thicker than the first part of the anti-reflection layer.

16. A display apparatus comprising:
a cover window;
at least one first display panel arranged on a rear surface of the cover window;
a second display panel spaced apart from the at least one first display panel;
a first printed layer arranged on the rear surface of the cover window around the at least one first display panel and the second display panel;
a second printed layer adhered to the cover window; and
an adhesive layer between each of the at least one first display panel and the second display panel, and the cover window,
wherein the first printed layer includes carbon black,
wherein the first printed layer partially covers edges of the at least one first display panel and the second display panel and fills an area between the at least one first display panel and the second display panel, and
wherein the second printed layer comprises an anti-fingerprint layer arranged as an uppermost layer, an anti-glare layer arranged beneath the anti-fingerprint layer, and an anti-reflection layer interposed between the anti-fingerprint layer and the anti-glare layer or between the rear surface of the cover window and the first printed layer.

17. The display apparatus according to claim 16, wherein the first printed layer laterally contacts the adhesive layer.

* * * * *